United States Patent [19]

Morozumi

[11] 4,394,586
[45] Jul. 19, 1983

[54] DYNAMIC DIVIDER CIRCUIT

[75] Inventor: Shinji Morozumi, Shimosuwa, Japan

[73] Assignee: Kabushiki Kaisha Suwa Seikosha, Tokyo, Japan

[21] Appl. No.: 408,148

[22] Filed: Oct. 19, 1973

[30] Foreign Application Priority Data

Oct. 19, 1972 [JP] Japan .................. 47/104830

[51] Int. Cl.³ ............... H03K 23/22; H03K 19/096
[52] U.S. Cl. ................... 377/105; 307/452; 307/481; 377/117
[58] Field of Search ............ 307/205, 214, 220 R, 307/220 C, 225 R, 225 C, 251, 279, 269, 452, 481, 583, 585; 58/23 A, 50 R; 368/85–87, 219

[56] References Cited

U.S. PATENT DOCUMENTS

| | | | |
|---|---|---|---|
| 3,431,433 | 3/1969 | Ball et al. | 307/221 C |
| 3,483,400 | 12/1969 | Washizuka et al. | 307/279 |
| 3,560,998 | 2/1971 | Walton | 58/23 A |
| 3,710,271 | 1/1973 | Putman | 307/205 X |
| 3,716,723 | 2/1973 | Heuner | 307/251 X |
| 3,737,673 | 6/1973 | Suzuki | 307/221 C X |
| 3,745,371 | 7/1973 | Suzuki | 307/221 C |
| 3,749,937 | 7/1973 | Rogers | 307/225 C |
| 3,757,510 | 9/1973 | Dill | 58/50 R X |
| 3,823,551 | 7/1974 | Riehl | 58/50 R X |
| 3,829,713 | 8/1974 | Canning | 307/225 C |
| 3,833,822 | 9/1974 | Carbrey | 307/304 X |

OTHER PUBLICATIONS

Suzuki et al., "Clocked MOS Calculator Circuitry"; IEEE Internat'l Solid-State Circuits Conference; Session VI: LSI Components, 2/14/1973.

*Primary Examiner*—Larry N. Anagnos
*Attorney, Agent, or Firm*—Blum, Kaplan, Friedman, Silberman & Beran

[57] ABSTRACT

A dynamic divider circuit comprised of insulating gate field effect transistors and capable of operation using minimal current consumption in a reduced space is provided. Master and slave multiple inverters and an intermediate inverter are formed from complementary connected P-channel and N-channel insulated gate field effect transistors, the master and the slave inverter being directly coupled to the master inverter. The coupling of the master, intermediate, and slave inverters providing reduced current consumption and a more simplified circuit by utilizing the parasitic capacitance of said field effect transistors as a memory.

17 Claims, 6 Drawing Figures

DYNAMIC DIVIDER CIRCUIT

BACKGROUND OF THE INVENTION

This invention relates generally to an improved dynamic divider circuit for use in an electronic timepiece and especially to a simplified dynamic divider circuit comprised of insulated gate field effect transistors. Dynamic divider circuits comprised of insulated gate field effect transistors consume significent amounts of power when operated at high frequencies. Because the size of a battery is limited in an electronic timepiece, and further because it is necessary to operate electronic timepieces at high frequencies, such divider circuits have been less than completely satisfactory.

SUMMARY OF THE INVENTION

Generally speaking, in accordance with the invention, a dynamic divider circuit comprised of inverters formed from insulated gate field effect transistors is provided. The dynamic divider circuit includes an intermediate inverter and a master and slave multiple inverters, both multiple inverters including a complementary connection of two series-connected P-channel and two series N-channel field effect transistors. The P-channel and N-channel transistors are coupled in such a manner that the output terminal of the master inverter is coupled through the intermediate inverter to the input terminal of the slave inverter, and the output terminal of the slave inverter is directly coupled to the input gate of said master inverter. A first clock pulse is supplied to the gate terminal of a further, series-connected N-channel transistor of said master inverter and to the gate terminal of a further series-connected P-channel transistor of said slave inverter. Similarly, a second clock pulse, which is the complement of said first clock pulse, is supplied to the gate terminal of a further series-connected P-channel transistor of said first inverter and the gate terminal of a further, series-connected N-channel transistor of said second inverter, the binary division of such divider circuit utilizing the parasitic capacitance generated by the field effect transistors of said first and second inverter circuits as a memory element.

Accordingly, it is an object of this invention to provide an improved dynamic divider circuit using complementary field effect transistors wherein the number of elements in such circuit is reduced.

It is a further object of this invention to provide an improved dynamic divider circuit in which current consumption is substantially reduced and in which response speed is increased.

It is still another object of this invention to provide a dynamic divider circuit wherein the parasitic capacitance at the drain terminal of said insulated gate field effect transistors provides a memory capability during the operation of said divider circuit.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
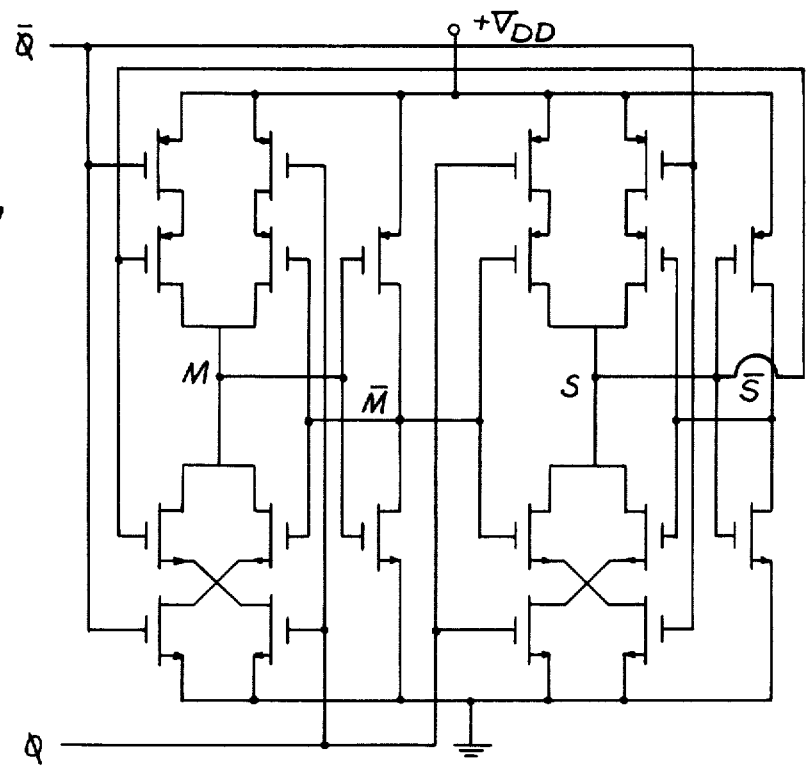
FIG. 1 is a circuit diagram of a prior art binary divider circuit.
Figure 2:
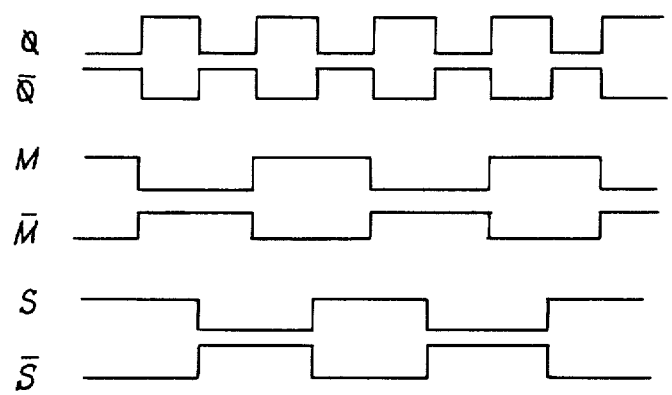
FIG. 2 is a timing chart of the input and output voltages of the circuit of FIG. 1.

Reference is made to FIG. 1, wherein a conventional master-slave flip-flop binary divider circuit is depicted. The divider circuit is comprised of 20 insulating gate field effect transistors and 10 N-channel insulated gate field effect transistors. As is depicted in the timing chart of FIG. 2, the binary divider circuit effects a division of the input clock pulse in such a manner when clock pulses $\phi$ and $\bar{\phi}$ are applied to the multi-inverter to determine a first and second condition. In a first condition a slave inverter S is written while the master inverters M and $\bar{M}$ hold their state, and in the second condition the master inverter M is written while slave inverters S and $\bar{S}$ are held constant. As is understood, the current consumption is determined by the amount of current flowing when both channels of the inverters are simultaneously in an ON condition when the inverter stages produce a change of state. There is a further consumption of current caused by the charging and discharging of parasitic capacitance on the drain side of each transistor through the respective channel resistances. Since each insulated gate field effect transistor has approximately the same physical construction and hence the same operating characteristics, when such elements are assembled in an integrated circuit chip, current consumption is determined by the number of such elements in the chip and the rate of changing state, more accurately characterized as the frequency at which the circuit is operated. Thus, when such divider circuits are operated at high frequencies in an electronic timepiece, the small-sized batteries are not capable of sustaining the power consumption over a long period of time due to their limited capacity.

Figure 3:
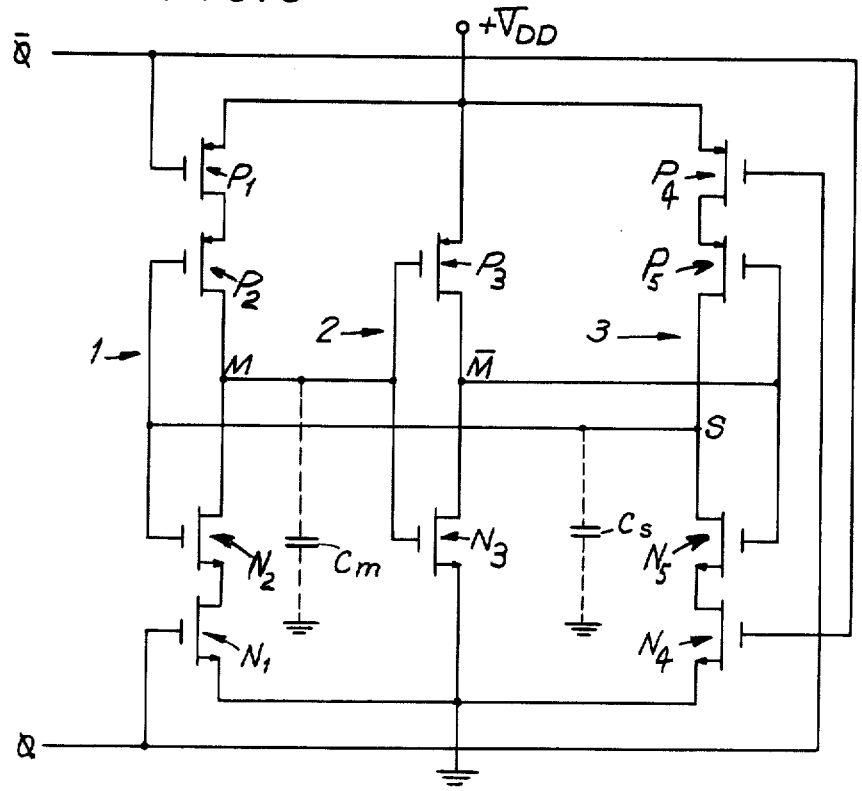
FIG. 3 is a circuit diagram of a dynamic divider circuit according to the instant invention.
Figure 4:
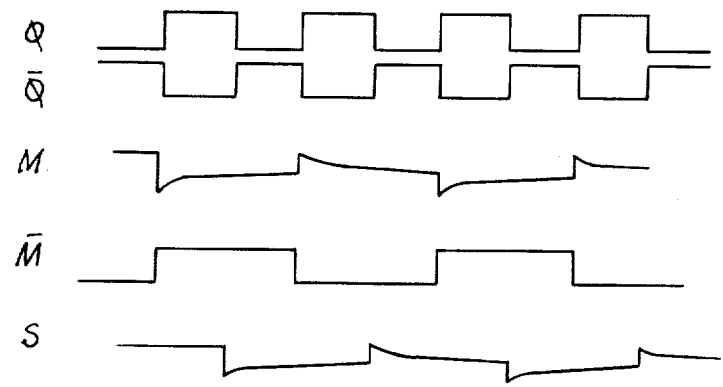
FIG. 4 is a timing chart of the input and output voltages of the circuit of FIG. 3.

Reference is now made to FIG. 3, wherein a dynamic binary divider circuit, including an intermediate inverter, generally indicated at 2, and two multiple inverters all generally indicated at 1 and 3, is depicted. First multiple inverter 1, hereinafter referred to as the master inverter includes a complementary connection of serially connected P-channel transistors $P_1$ and $P_2$ to serially coupled N-channel transistors $N_1$ and $N_2$. Similarly, second multiple inverter 3, hereinafter referred to as the slave inverter, is comprised of a complementary connection of serially connected P-channel transistors $P_4$ and $P_5$ to serially connected N-channel transistors $N_4$ and $N_5$. Intermediate inverter 2 is comprised of a complementary connection of P-channel transistor $P_3$ to N-channel transistor $N_3$. The master inverter is coupled at output M, defined by the node formed by the connection of the drain terminals of transistors $P_2$ and $N_2$ to the input of the intermediate inverter 2, which input is defined by the node formed by the coupling of the gate terminals of transistors $P_3$ and $N_3$. The output $\overline{M}$ of the master inverter is defined by the node formed by the connection of the drain terminals of transistors $P_3$ and $N_3$ and is coupled to the input of the slave inverter defined by the node formed by the connection of the gate terminals of transistors $P_5$ and $N_5$. The output of the slave inverter defined by the node formed by the connection of the drain terminals of transistors $P_5$ and $N_5$ is directly coupled to a node of said master inverter defined by the connection of the gate terminals of transistors $P_2$ and $N_2$. The master and slave inverters are also directly coupled to each other by the coupling of the source terminals of $P_1$ to $P_4$ and $N_1$ to $N_4$. Finally, clock pulse $\phi$ is coupled to the master inverter at the gate terminal of transistor $N_1$ and to the slave inverter at the gate terminal of transistor $P_4$ and clock pulse $\overline{\phi}$, is coupled to the master inverter through the gate terminal of transistor $P_1$ and is coupled to the slave inverter through the gate terminal of transistor $N_4$. Thus, as is understood, the condition of the master inverter M and the slave inverter S is determined by the condition of the clock pulses $\phi$ and $\overline{\phi}$ in the manner depicted in FIG. 4.

In accordance with the invention, equivalent capacitors $C_m$ and $C_s$ are depicted in dotted lines in FIG. 3. Capacitors $C_m$ and $C_s$ represent the equivalent capacitance caused by the operation of the divider circuit and the characteristics of the transistor elements. Such capacitance, known as parasitic capacitance, is present at the junctions formed in the insulated gate field effect devices and by the metallic wiring of such field effect transistors. It is a feature of this invention that such equivalent capacitances found at the output terminals of the master inverter and the slave inverter are utilized as memory elements for holding the states of the inverter circuits. In actual use, the contents memorized by such capacitive elements are changed according to the actual time constant created by the leakage currents, the effective capacitance at the drain terminals, and the rate at which charging and discharging is effected. However, if the time constant is equal to or greater than the value required to sustain the state of the inverter until the next change in state dictated by the clock pulse is applied to the divider circuit, the decaying effect of the time constant has no effect on the operation of the divider circuit. Moreover, because such leakage currents at the drain terminals are of the order of 1 picoampere and the parasitic capacitance seen at such terminals is of the order of 1 picofared, generally, the time constant effected thereby for such field effect transistors is several seconds allowing the use of such divider circuits for dividing signals of up to and including 1 Hz.

Figure 5:
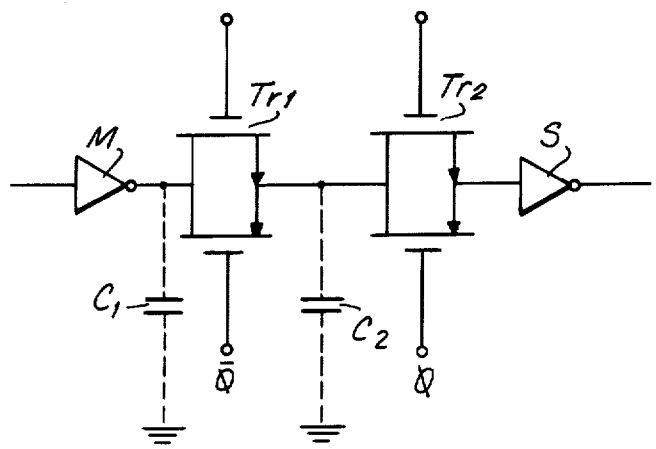
FIG. 5 is an equivalent circuit diagram of a prior art transmission-type binary divider circuit in operation.
Figure 6:
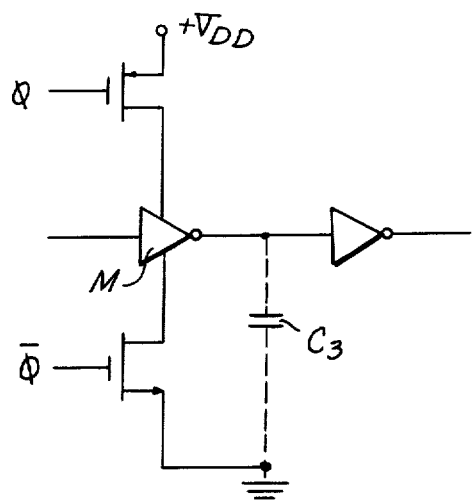
FIG. 6 is an equivalent circuit diagram of the dynamic divider circuit constructed in accordance with the instant invention.

Reference is made to FIG. 5, wherein an equivalent circuit of the transmission-type dynamic divider circuit of the prior art is depicted. A voltage is held, or memorized, by the parasitic capacitance $C_1$ on the drain side of a master inverter M and a transmission transistor $Tr_1$ when transistor $Tr_1$ is OFF. Similarly, a voltage is memorized by the parasitic capacitance $C_2$ which is effected at the source side of transistor $Tr_1$ and the drain side of transistor $Tr_2$ when transistor $Tr_1$ is turned ON. Moreover, when transistor $Tr_2$ is turned ON, to thereby transmit the contents held thereby to slave inverter S, the voltage applied thereto is divided in the ratio of to $C_1:C_2$, and the operating point of the inverter can be knocked out of position. Thus, in designing transmission-type dynamic divider circuits, the design of such circuits is restricted by the need to provide a $C_1$ much larger than $C_2$. In condradistinction thereto, in accordance with the instant invention as depicted in FIG. 6, the Master inverter M is always connected to the input of the slave inverter S in a more direct manner, thus resulting in significantly stabilized operation up to certain frequencies and hence higher response speeds by comparison with said transmission-type dividers.

Accordingly, if the circuit depicted in FIG. 3 is utilized in an integrated circuit chip, the reduction of such a binary divider circuit from 20 elements to 10 elements yields a reduction in the current utilized by such a device of one half. Moreover, the chip size is also reduced by one half due to the necessity of utilizing fewer elements, thus reducing the cost of manufacturing such divider circuits and the space in the timepiece occupied by the chip. Finally, because less current is required, the battery life is extended. These improvements are particularly significant in effecting improved electronic wristwatches.

It will thus be seen that the objects set forth above, among those made apparent from the preceding description, are efficiently attained, and since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be able to fall therebetween.

What is claimed is:

1. A dynamic binary divider circuit comprised of an intermediate inverter, a first multiple inverter and a second multiple inverter, said intermediate inverter being formed by the complementary connection of a P-channel transistor and an N-channel transistor, each said first and second multiple inverters being formed from the serial connection of two-series-connected P-channel transistors to two series connected N-channel transistors respectively, the drain terminals of one of the P-channel and N-channel transistors of each multiple inverter being connected together to define an output terminal of the respective multiple inverter, the gate terminals of said one of the P-channel and N-channel transistors of each multiple inverter being connected together to define an input terminal of the respective inverter, said output terminal of said first multiple inverter being coupled through said intermediate inverter to the input of said second multiple inverter, the output terminal of said second multiple inverter being coupled to the input terminal of said first multiple inverter, the other P-channel transistor of said first multiple inverter and the other N-channel transistor of said second multiple inverter being connected for receipt at the respective gate terminals thereof with a first clock pulse and the other N-channel transistor of said first multiple inverter and the other P-channel transistor of said second multiple inverter being connected for receipt at the respective gate terminals thereof with a second clock pulse which is the complement of said first clock pulse whereby the parasitic capacitance at respective outputs of said first and second multiple inverters is utilized as a memory means, so that a division of said clock pulse applied is effected.

2. A divider circuit as recited in claim 1, wherein the respective source terminal of each of the P-channel transistors of the first and second inverters are connected together and wherein the respective source terminal of each of the other N-channel transistors of the first and second inverters are connected together.

3. A dynamic divider circuit for use in an electronic timepiece comprising a master inverter, a slave inverter, and an intermediate inverter, said master and slave inverters each including first and second serially connected P-channel field effect transistors and first and second N-channel serially connected transistors, the second N-channel and P-channel transistors of each of said master and slave inverters being complementary coupled so as to define master and slave inverter output terminals and a master and slave inverter input terminal, the respective gate terminals of the first N-channel transistor of said master inverter and the first P-channel transistor of said slave inverter are connected to receive a first clock pulse $\phi$ having a first frequency, the respective gate terminals of the first P-channel of said master inverter and the first N-channel transistor of said slave inverter connected to receive a second clock pulse $\overline{\phi}$ which is the complement of said first clock pulse, the output of said master inverter producing a signal M having a second frequency equal to one-half said first frequency, said master inverter being coupled through said intermediate inverter to produce a complementary input $\overline{M}$ for application to said slave inverter, and the output of slave inverter being a frequency equal to said second frequency but delayed by a period equal to one-half the period of first clock pulse $\phi$, applied to the input of said master inverter, whereby the parasitic capacitance at the common output terminals of said master and slave inverters is utilized as a memory means, the leakage current and the effective capacitance determining the operating frequencies of said divider.

4. A divider circuit as recited in claim 3, wherein the respective drain and gate terminals of said second N-channel and P-channel transistors of each of said master and slave inverters are connected together to define said complementary connection.

5. A divider circuit as recited in claim 4, wherein the respective drain terminal of each first N-channel and P-channel transistor is connected to the respective source of the transistor series-connected therewith.

6. A divider circuit as recited in claim 5, including a source of voltage and ground, wherein the respective source terminals of said first P-channel transistors are connected together, and the respective drain terminals of said first N-channel transistors are connected together between said source of voltage and ground.

7. A divider circuit as recited in claim 6, wherein said intermediate inverter includes a P-channel and an N-channel transistor complementary connected between said source of voltage and ground.

8. The combination comprising, first and second selectively operative inverting means, each inverting means having a signal input terminal, a power input terminal means and an output; an inverter having an input connected to said output of said first inverting means, and having an output connected to said signal input terminal of said second inverting means; means connecting said output of said second inverting means to said signal input terminal of said first inverting means; and means for applying control signals to the power input terminal means of said first and second inverting means to render operative said first inverting means and render inoperative said second inverter during one time interval and for rendering inoperative said first inverting means and rendering operative said second inverting means during another time interval.

9. The combination comprising, first and second selectively operative inverter means each having an input and an output; a continuously operative inverter having an input coupled to said output of said first inverter means, and having an output coupled to said input of said second inverter means; means coupling said output of said second inverter means to said input of said first inverter means; and means for rendering operative one of said first and second inverter means at a time.

10. The combination as claimed in claim 9 wherein each one of said first and second inverter means includes first and second transistors each having a control electrode and a conduction path, wherein the control electrodes of the two transistors of each one of said first and second inverter means are connected to said input of the first and second inverter means, respectively, and wherein the conduction paths of said first and second transistors of said first and second inverter means are coupled to said output of said first and second inverter means, respectively, for charging and discharging the respective said output, when said inverter means is rendered operative; and wherein each one of said first and second inverter means includes means for selectively applying an operating potential across the conduction paths of said first and second transistors.

11. The combination comprising, two power terminals for the application therebetween of an operating potential; first and second inverting means connected in parallel between said two power terminals; each inverting means having an input and an output and including a first switch means connected in series with a first controllable conduction means between one of said power terminals and said output and including a second switch means connected in series with a second controllable conduction means between the other one of said power terminals and said output; an inverter having an input and an output, the input of said inverter being connected to the output of said first inverting means and the output of said inverter being connected to the input of said second inverting means; means connecting the output of said second inverting means to the input of said first inverting means; and means for applying signals to said switch means for during one time interval closing the two switch means of said first inverting means and opening the two switch means of said second inverting means and for during a second succeeding time interval opening the two switch means of said first inverting means and closing the two switch means of said second inverting means.

12. The combination as claimed in claim 11, wherein each one of said first controllable conduction means includes a first transistor having first and second electrodes defining the ends of a conduction path and a control electrode for controlling the conductivity of said path, each said first switch means being connected in series with the conduction path of the associated said first transistor; wherein each one of said second controllable conduction means includes a second transistor having first and second electrodes defining the ends of a conduction path and a control electrode, each said second switch means being connected in series with the conduction path of the associated said second transistor; and wherein the control electrodes of said first and second transistors of each inverting means are connected to the input of that inverting means.

13. The combination as claimed in claim 12 wherein each one of said switch means is a switching transistor having a conduction path and a control electrode; and wherein said means for applying signals to said switch means includes means for applying signals to the control electrodes of said switching transistors.

14. The combination as claimed in claim 13 wherein one of the two switching transistors is of one conductivity type and the other one of the two switching transistors is of a second, complementary, conductivity type.

15. The combination as claimed in claim 13, wherein said first and second transistors of each inverting means are of complementary conductivity type and wherein each switching transistor is of the same conductivity type as the transistor to whose conduction path it is serially connected; and wherein said means for applying signals include means for applying complementary signals to the control electrodes of the switching transistors of an inverting means.

16. The combination as claimed in claim 15, wherein each one of said transistors is an insulated gate field effect transistor having a gate electrode and source and drain electrodes wherein said source electrode is said first electrode, said drain electrode is said second electrode and wherein said gate electrode is said control electrode; and wherein said inverter includes two transistors of complementary conductivity type having their conduction paths connected in series between said two power terminals.

17. The combination as claimed in claim 16, wherein said two transistors of said inverter are insulated gate field effect transistors.

* * * * *